United States Patent [19]

Hass et al.

[11] Patent Number: 5,568,407
[45] Date of Patent: Oct. 22, 1996

[54] METHOD AND SYSTEM FOR THE DESIGN VERIFICATION OF LOGIC UNITS AND USE IN DIFFERENT ENVIRONMENTS

[75] Inventors: Jurgen Hass, Sindelfingen; Rolf Hilgendorf, Boblingen; Siegfried Neuber, Sindelfingen; Thomas Schlipf, Holzgerlingen; Hartmut Ulland, Altdorf, all of Germany

[73] Assignee: International Business Machines Corporation, Armonk, N.Y.

[21] Appl. No.: 469,187

[22] Filed: Jun. 6, 1995

[30] Foreign Application Priority Data

Jan. 3, 1995 [EP]  European Pat. Off. .............. 95100052

[51] Int. Cl.$^6$ .................................................. G05B 19/045
[52] U.S. Cl. .......................... 364/579; 364/488; 364/489; 371/27; 324/73.1
[58] Field of Search ........................... 364/579, 488–490; 371/22.1, 22.3, 22.4, 27, 25.1, 27; 324/73.1, 527

[56] References Cited

U.S. PATENT DOCUMENTS 4,688,222   8/1987   Blum ........................... 371/22.4
5,142,223   8/1992   Higashino et al. ..................... 371/22.1
5,212,443   5/1993   West et al. ............................. 371/22.1
5,225,772   7/1993   Cheung et al. ........................ 324/73.1
5,243,273   9/1993   McAuliffe et al. .................... 324/73.1
5,293,374   3/1994   Eidson ................................... 324/73.1

OTHER PUBLICATIONS

"Random Finite State Machines", *IBM Technical Disclosure Bulletin*, vol. 37, No. 03, Mar. 1994, pp. 223–224.

*Primary Examiner*—Emanuel T. Voeltz
*Assistant Examiner*—Hal D. Wachsman
*Attorney, Agent, or Firm*—Marc A. Ehrlich

[57] ABSTRACT

A method and system for the design verification of logic units capable of providing verification of a logic unit design prior to chip production. At least one test unit is coupled to a logic unit via an interface. The test unit includes a set of operations which are applied to the logic unit. The selection of test operations to be applied to the logic unit and the determination of the start times thereof are executed randomly and independently of each other. Thus, with the present method and system two parameters of the test operation generating event: the sequence of the test operations, and the temporal relationship between the test operations, are independently and randomly modified.

26 Claims, 6 Drawing Sheets

METHOD AND SYSTEM FOR THE DESIGN VERIFICATION OF LOGIC UNITS AND USE IN DIFFERENT ENVIRONMENTS

The present invention is generally directed to the verification of physical failures in digital circuits which have accidently occurred in their fabrication process. In particular, the invention relates to the verification that logic units are free of design errors.

In these verification tests the behavior of a logic unit under test is compared with the behavior of a reference model, which could be a "golden" circuit, but typically is a mathematical abstraction using Boolean algebra which neglects physical parameters like signal rise time, voltage levels, etc.

BACKGROUND ART

Pertinent prior art systems comprise a ONE to ONE correspondence between the tested elements of the physical model and a reference model, e.g. the gates or latches. For the verification of physical failures in those systems a test unit applies to the physical model stimuli patterns and receives response patterns from this model, which are compared with simulated response patterns of a reference model, to which the same stimuli patterns were applied.

These deterministic tests are not suitable for covering the whole spectrum of operations of a physical logic unit. Therefore, in the last years pseudo-random tests have been used for test data generation purposes. Those pseudo-random tests all work in a similar way:

1. All bistable elements (called in the following SRLs for Shift Register Latches) are set up to pseudo-random values. The SRLs are connected into one or several shift chains and a Pseudo-Random Pattern Generator (PRPG) supplies the data at the inputs of the shift chain. During that phase the SRLs are clocked in such a way that the value of an SRL is sent to the next SRL in the shift chain. The outputs of the combinational logic are not fed into the SRLs.
2. If all SRLs have been set up with pseudo-random values, a system clock is applied, which copies the outputs of the combinational logic into the SRLs.
3. The SRL values are shifted out to a Signature Register, which generates a compressed signature of the logic values, which were generated by the combinational logic. This signature value is compared with a simulated signature.

Central to that well-known approach is the premise that values of all bistable elements comprising a state vector could be controlled and observed.

In the area of the verification of design errors, deterministic tests are also not sufficient. These tests are difficult to generate and their test coverage is often quite low. Therefore, random tests have been used for several years to verify e.g. a processor implementation against the underlying processor architecture. In that case, random instruction streams are generated, and at the end of an instruction stream the value of the architected state vector, e.g. registers, condition codes or memory contents, is compared with a simulated value. The simulated value is derived from a high level description of the architecture, i.e. the architecture model, which abstracts implementation details, e.g. the number of pipeline stages or the number of instruction units. It is obvious that the architecture state vector is a subset of the implementation state vector and that there is no ONE to ONE correspondence between the architecture and the implementation. Due to this, much effort is required to describe the architecture model. This effort is only justified for processor architectures, which typically last much longer than processor implementations.

Further, the approach described above is not very useful for testing bus protocols or data communication protocols for two reasons:

1. There is no equivalent to an architecture model since the effort required is prohibitive.
2. In the test of bus protocols not only the sequence of operations is important, but in addition the starting times of the different operations and the relationship between these starting times. It is emphasized that in a processor the instruction sequence determines exactly, at which time the instruction is executed.

Since there is no equivalent to an architecture model the compare values must be predicted. In particular, the prediction of the total state vector of a system is very error prone and time consuming.

U.S. Pat. No. 4,688,222 discloses a method for error testing and diagnosing processors which includes technology and design relevant errors and wherein pseudo-random generated test programs or pseudo-random operation codes are employed which have been previously stored in a test program memory. This method applies random test patterns to the processor under test in a predefined time sequence, and is directed to the verification of physical failures, but not design relevant logic failures. It is based on changes of the total system state, wherein only this system state is detected.

The above-mentioned approaches according to the state of the art all have the disadvantage that they only check physical failures in logic devices. Those test units use correct reference models which can exist as a physical reference model or a mathematical abstraction of such a unit. This reference model is considered as working correctly in the system environment. Verification is fulfilled by comparing the physical copies with the reference model.

SUMMARY OF THE INVENTION

It is an object of the present invention to provide a method and a system for the design verification of logic units which is suitable to verify the design of logic units, particularly before chip production, with less effort than known in prior art systems.

It is a further object to provide a method and a system for the design verification of logic units, which can be applied to logic units comprising a large number of VLSI-devices, or for the verification of a very complex reference model, whether it works logically correct. In a complex system environment many events have to meet for specifically activating a logic function. Further, it should be known which event can activate such a logic function and what is the time relationship of these events.

BRIEF DESCRIPTION OF THE DRAWINGS

FIG. 4 shows a typical data processing system for which the present invention can be applied to;

DETAILED DESCRIPTION OF THE INVENTION

Figure 1:
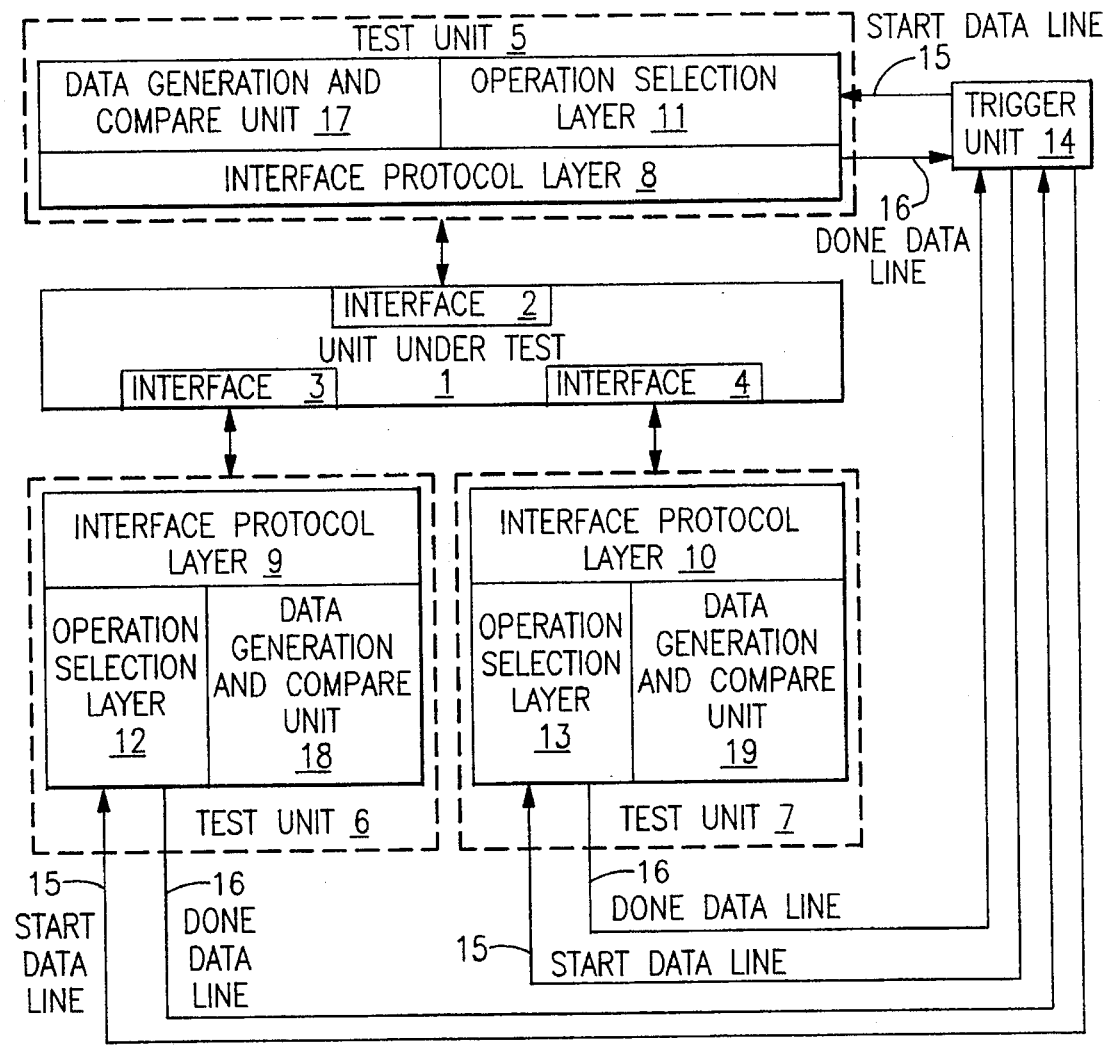
FIG. 1 is a schematic diagram showing the basic principles of the present invention.

In accordance with the present invention, a method is provided for the design verification of logic units whereby the logic units comprise interface means and bus means for communication with external devices. At least one test unit is provided which is connected with a logic unit via the interface means. The test units comprise a set of test operations which are applied to the logic unit. In particular, the selection of test operations and the determination of their start times are executed randomly and independently of each other.

This approach augments the prior art approaches by the following features:

1. For the application of test operations to a logic unit the parameter "time" is taken into account.
2. This method does not require the prediction of a "total state vector", but does compares on an operation basis.

The method according to the present invention involves a dramatic improvement in comparison with pertinent prior art solutions. As described in the introduction, testing is a two-step procedure: 1) The generation of an event; and 2) Observing the effect of this event.

In case of generating events, this new approach modifies independently two parameters in a random way:

1. The "sequence" of the test operations; and
2. The temporal relationship between these operations.

The independence of these parameters effects a much higher coverage of logic failures of the units under test. In addition, the time required for an entire test procedure can be reduced considerably.

In a preferred embodiment of the present invention at least two test units are employed which are selected randomly and independently of each other. The test units are connected with the logic unit via different interfaces. All the interfaces of the test unit can be verified at the same time, wherein the variety of possible operations is importantly increased.

In a further embodiment of the present invention the test units comprise an interface protocol level and a selection of operations level. This kind of partitioning of the test units is very useful for testing bus protocols or data communication protocols. Additionally, these test units comprise a very simple architecture and can be realized with relatively small technical effort.

Further preferred embodiments of the invention are disclosed in claims 4 to 7. These embodiments are advantageous because the selection of test operations and the determination of their start times are determined randomly and independently of each other in a very effective manner.

The present invention also relates to a system for the design verification of logic units, which comprises interface means and bus means for communication with external devices, and operation means for operating a bus protocol. The system employs at least one test unit, which is connected with a logic unit via the interface means. Each test unit comprises means for a random selection of test operations, means for data generation and data comparison in order to compare the generated data with the data obtained from the test operation, and trigger means which are connected with each of the test units in order to attain truly random starting times for the operations. The system is advantageous because it can be built with only a small number of devices which operate effectively to solve the underlying problem addressed by the invention.

In a preferred embodiment of the invention, the trigger means are connected with the operation select level of each test unit by two data lines, wherein via the first line a START signal is delivered by the trigger means and via the second line a DONE signal is delivered by the operation select means. Thus, the test units can be operated independently from all the other test units.

In a further preferred embodiment of the invention, the operation select level has at least one random pattern means comprising a pseudo-random pattern generator, a register for the maximum number of operations, a modulo operation device, an operation select pointer and storage means which keeps a collection of the available operations. This setup of the operation select level only requires a minimal set of hardware components. In particular, this kind of operation select level can be also implemented in a simulation environment.

Further preferred embodiments of the system according to the present invention are the subjects of claims 12 and 13. Their advantage over the state of the art becomes evident with regard to the following description.

Finally, three exemplary uses of the invention in different environments are the subject matter of claims 14 to 16. The advantages of these embodiments also become evident with regard to the following description.

Logic chip design verification is a two-step test procedure whereby first an event is generated, and second the effect of this event is observed. The generation of events in light of the present invention is accomplished by independently modifying two parameters in a random way: The sequence of the test operations and the temporal relationship between these operations.

The principles of the new approach according to the present invention are illustrated in FIG. 1, wherein a unit under test 1 and its interfaces 2, 3, 4 are shown. It becomes evident here that these interfaces 2, 3, 4 are being served by independent test units 5, 6, 7 respectively. It is emphasized that a test unit is a logical entity, which must not correspond with a physical entity. Each test unit 5, 6, 7 is partitioned in a layer 8, 9, 10 which serves the protocol of the interface 2, 3, 4, and a layer 11, 12, 13 which selects an operation which is to be executed on that interface. The selected operation is chosen randomly from a set of possible operations, whereby a test unit can be operated independently from all the other test units.

As shown in FIG. 1, the test units 5, 6, 7 are started from a central trigger unit 14. For that purpose each test unit 5, 6, 7 has a START signal to determine the start time for the beginning of a test operation. If a test unit 5, 6, 7 has terminated its test operation, it signals this information to the trigger unit 14 via a DONE signal.

The separate protocol layers 8, 9, 10 of the test units 5, 6, 7 enable the units to execute their test operations on different interfaces 2, 3, 4 of the unit under test, respectively. The test units 5, 6, 7 each have their own operation select unit 11, 12, 13 with the consequence that on each interface of the unit under test a different test operation can be executed at a given time.

The test units 5, 6, 7 are connected with the trigger unit 14 via two data lines 15, 16 wherein the first line 15 serves the test units 5, 6, 7 with a START signal and the second line 16 serves the trigger unit 14 with a DONE signal.

Further, the test units 5, 6, 7 comprise a data generation unit 17, 18, 19 for generating data, for which the test operations are executed. In the unit, which is the target of an operation, the data received is compared with predicted data. The prediction of the data of an operation is done using non-data information contained in an operation.

A test operation typically consists of a command, an address, and data, which have to be transmitted on a bus. According to the present invention it is proposed that the command and/or address are used as a seed to generate the data in a pseudo-random way. A data compare unit 17, 18, 19, which exemplary coincides with the data generation means in this embodiment, has all the information to calculate the data, which the data generation unit 17, 18, 19 has to be sent and compares the calculated data with the data received. If there is a mismatch, an error must have occurred. There are many known techniques to realize this kind of seed.

Figure 2:
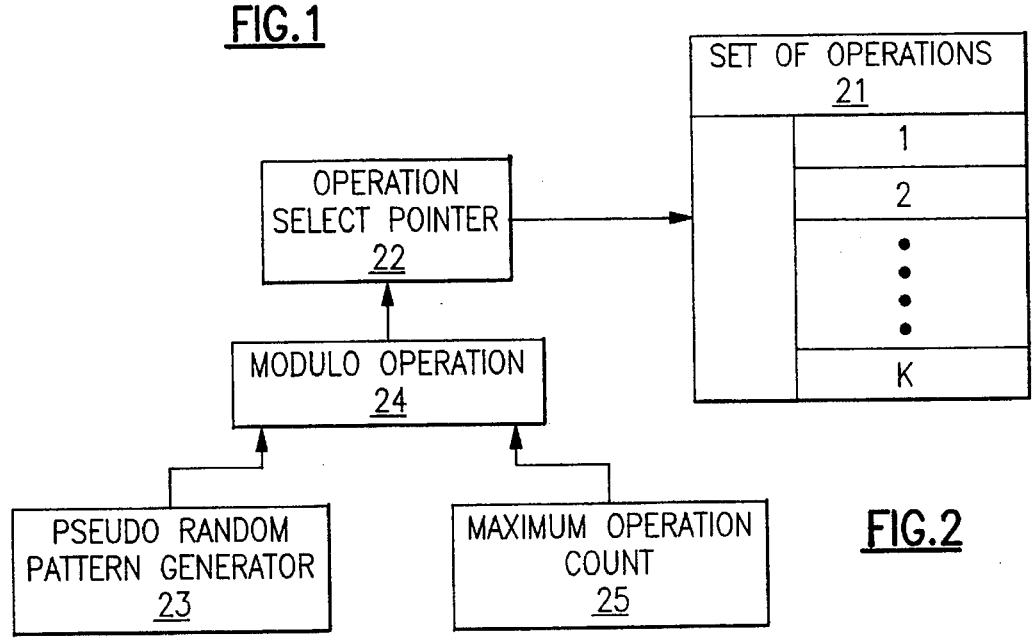
FIG. 2 illustrates the principle aspects of the operation select unit according to the invention.

FIG. 2 is a schematic diagram of the operation select unit 11, 12, 13. Each operation is selected from a set 21 of operations 1 ... k, whereby the organization of this set as a list structure is only exemplary and it is well known by those skilled in the art that those sets could be created in a multitude of ways.

An operation select pointer 22 is used for selecting an operation out of list 21. Herein the value of this operation pointer 22 has two properties, namely it is pseudo-random caused by a Pseudo-Random Pattern Generator 23 (PRPG), and the value is always equal or less the maximum number of operations due to a modulo operation 24.

The register "maximum operation count" 25 contains the number of possible operations and is used as an operand in the modulo operation 24. After an operation has been selected, the pseudo-random pattern generator 23 (PRPG) is switched to the next pseudo-random value.

Figure 3:
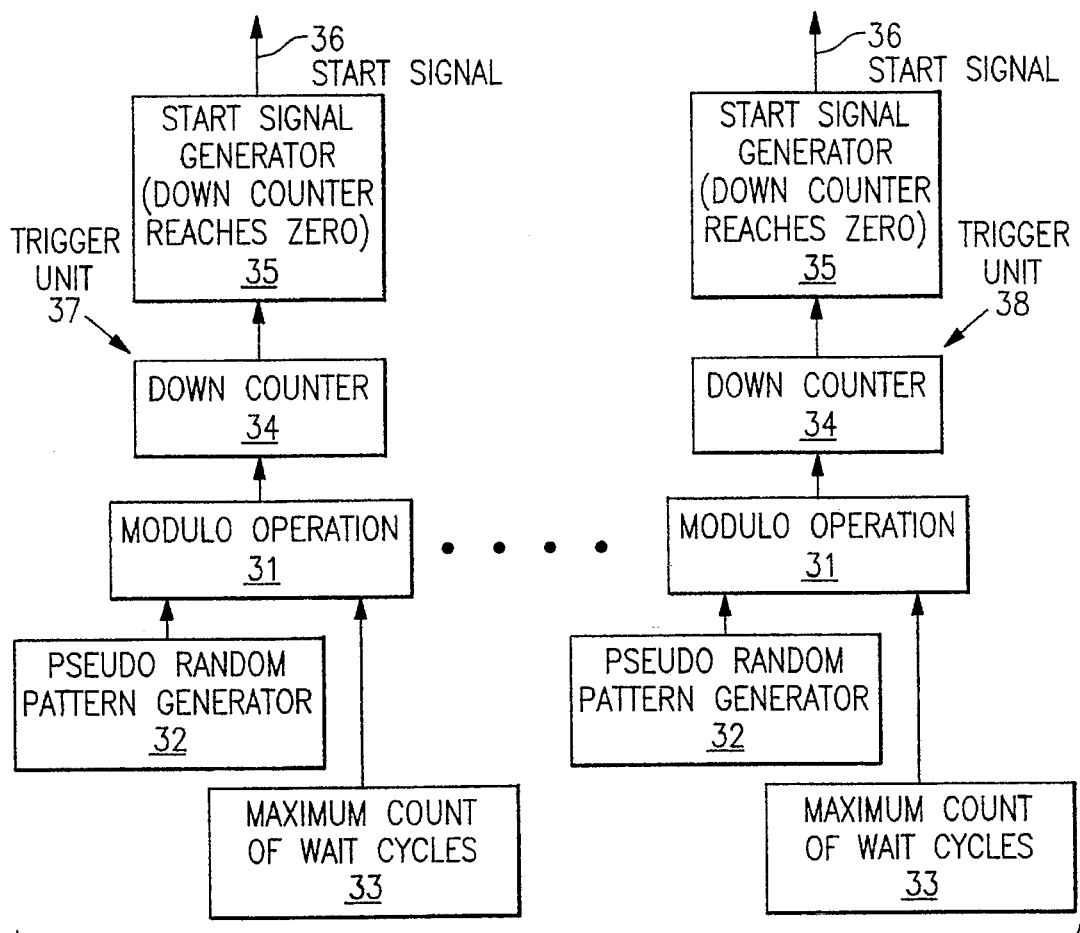
FIG. 3 depicts the principle aspects of the trigger unit according to the present invention.

Referring now to FIG. 3, trigger unit 14 is shown whereby a modulo operation 31 executed on the basis of a pseudo-random number generated by a PRPG 32 delivers a pseudo-random count of wait cycles, which lies between a maximum count of wait cycles 33 and zero. This pseudo-random number is loaded into a down counter 34. If this down counter reaches zero 35, a start signal 36 for the corresponding test unit is generated. The down counter 34 is decremented in every cycle. Under two conditions a new value will be loaded into the down counter 34: If the DONE signal is active on the corresponding test unit, and if all DONE signals have gone active on all test units. This approach ensures that a new set of operations starts from an idling state of the bus. If this is not desired, a new load of the down counter could be done, only when corresponding DONE signal becomes active.

FIG. 3 employs one trigger unit 37, 38 for each test unit. It is conceivable by one skilled in the art to employ only one trigger unit for all test units, leading to only one down counter cycle for all of these test units.

The scheme to generate pseudo-random numbers with a maximum value is similar to the scheme used in the operation select unit. Therefore the scheme has the advantage that the technical circuit aspects are the same as for the operation select unit.

Figure 4:
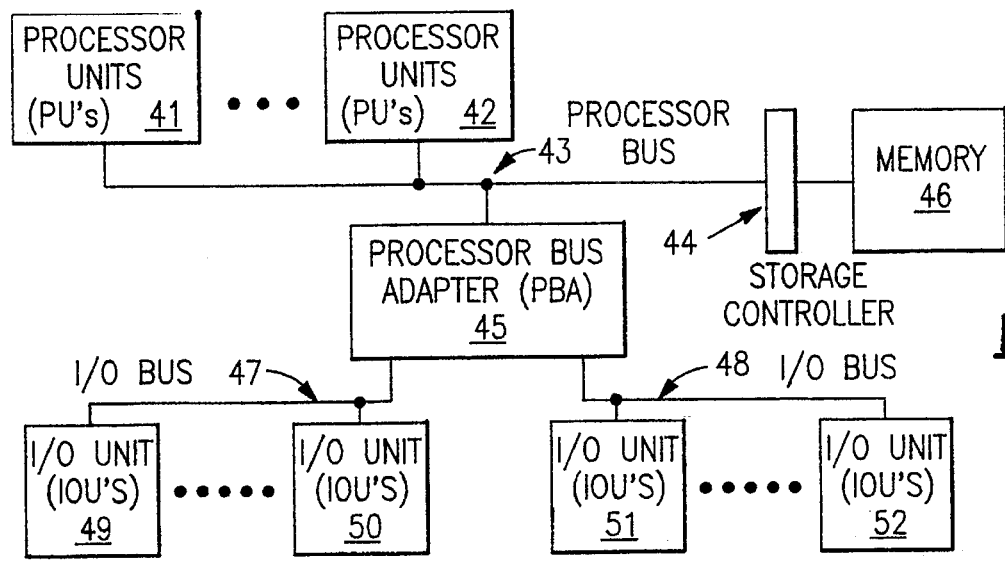
Figure 5:
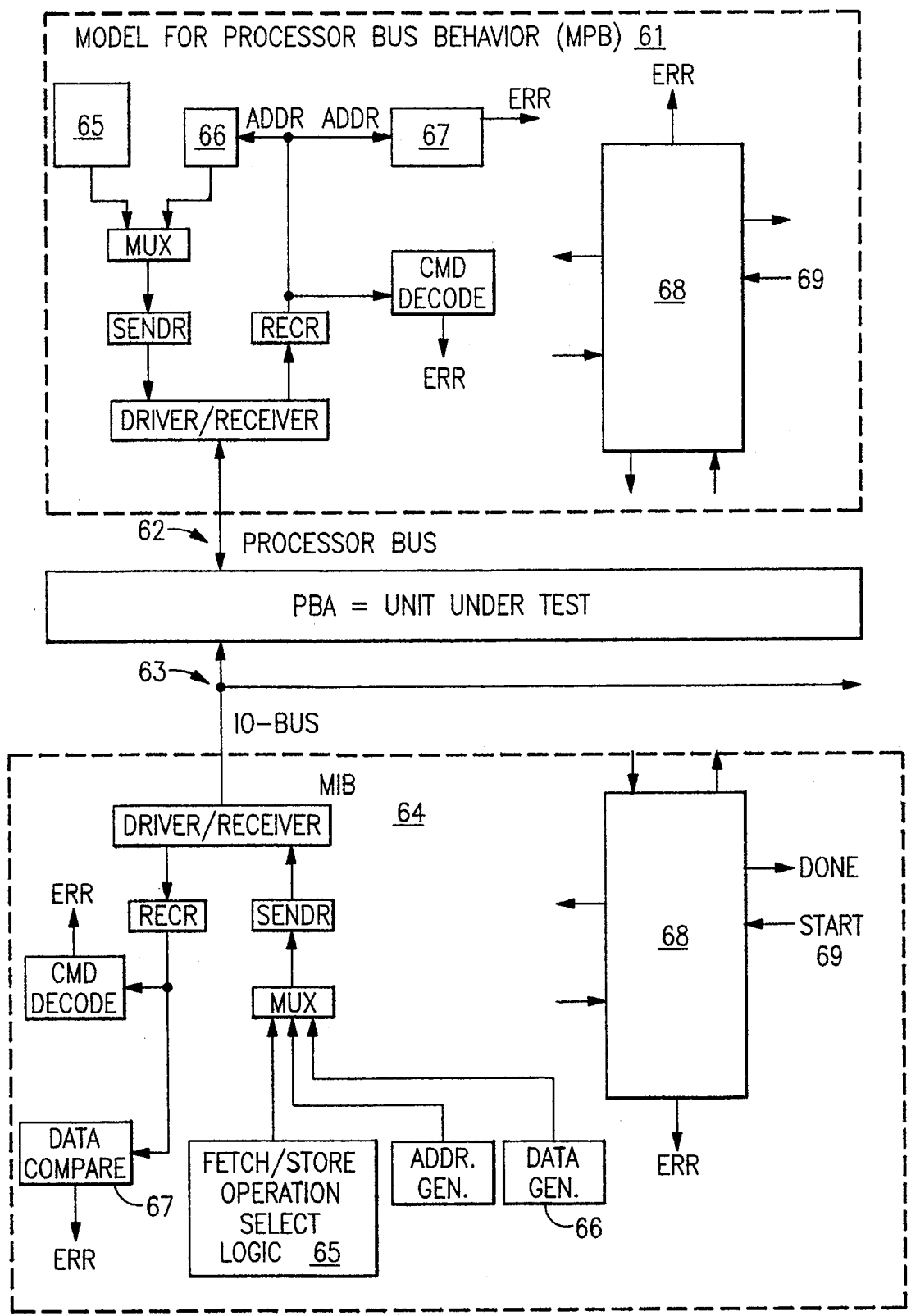
FIG. 5 shows an exemplary use of the invention to the verification of a Processor Bus Adapter (PBA) in a simulation environment.

FIGS. 4 and 5 illustrate the method of verification of a logic unit embedded in a simulation environment. In FIG. 4, as a simulation environment, a schematic diagram of a data processing system is shown with one or several PUs 41, 42 connected via a processor bus 43 to a Storage Controller 44 (STC) and a Processor Bus Adapter 45 (PBA). The STC 44 manages the access from the PUs 41, 42 or the PBA 45 to a memory 46. The PBA 5 is connected with the processor bus 43 via two IO-buses 47, 48 comprising up to 16 input/output units 49, 50, 51, 52 (IOUs).

In this simulation environment, which is shown in more detail in FIG. 5, the real chips being connected with the processor bus are thought to be replaced by a Model for the Processor Bus behavior 61 (MPB), which is able to generate random protocol sequences on a processor bus 62. The chips being interconnected by an IO-bus 63 are also replaced by a Model for IO Bus behavior 64 (MIB), which is able to generate random protocol sequences on the IO-bus. Since the structure of both models is similar, the following description focuses on the MIB 64 only.

An Operation Select Logic 65 is used to select out of the set of possible operations one operation randomly. In this example, the set consists of 32 possible operations, e.g. 16 different fetch and 16 different store operations.

The operation select logic 65 also randomly selects an address. If the value of the address influences the protocol of the operation, this has to be considered in the operation selection leading to a larger set of possible operations.

A Data Generation Logic 66 generates data in a pseudo-random way. This data must be generated in such a way that a data compare logic 67 can predict the data and compare the predicted data with the received data. For that purpose, the value of the address is used as a seed value for the data generation. There are a lot of different data generation techniques possible, which rely on different, but predictable, seed values.

The Data Compare Logic 67 compares the data received from the data generation logic 66 with the data expected for the operation. For illustrating the basic aspects of the invention it is assumed that the MIB 64 has selected randomly a store operation and has generated in a random way an address for the store operation. The value of the address used is a start value for the pseudo-random generation of the store data. Therefore, the MPB 61 could use the store address received to predict the data, which must follow. This predicted data is compared with the data actually received. For a fetch operation the MPB 61 generates pseudo-random data using the fetch address as an initial seed value. The data compare logic 67 in the MIB 64 can predict these data and compare them with the actual received data in the same way.

A Protocol State Machine 68 is triggered by the start signal 69 from a trigger unit (not shown) and directs the operation select logic 65 to select an operation. All the elements of the required bus protocol are controlled by this logic. In addition, it checks the validity of the timing parameters.

It is emphasized that in a simulation environment alternative ways of comparing data sent and data received, e.g. on a decentralized basis, are conceivable. A suitable solution could be the use of a global storage, to which all senders and receivers have access.

If any of the elements shown in FIG. 5 detects an error the simulation stops and problem analysis can be performed by well-known prior art techniques. But a recreation of the underlying problem for debugging purposes can be done easily, since only pseudo-random values are used. These values can be saved and used to recreate the problem in the next simulation run.

Figure 6:
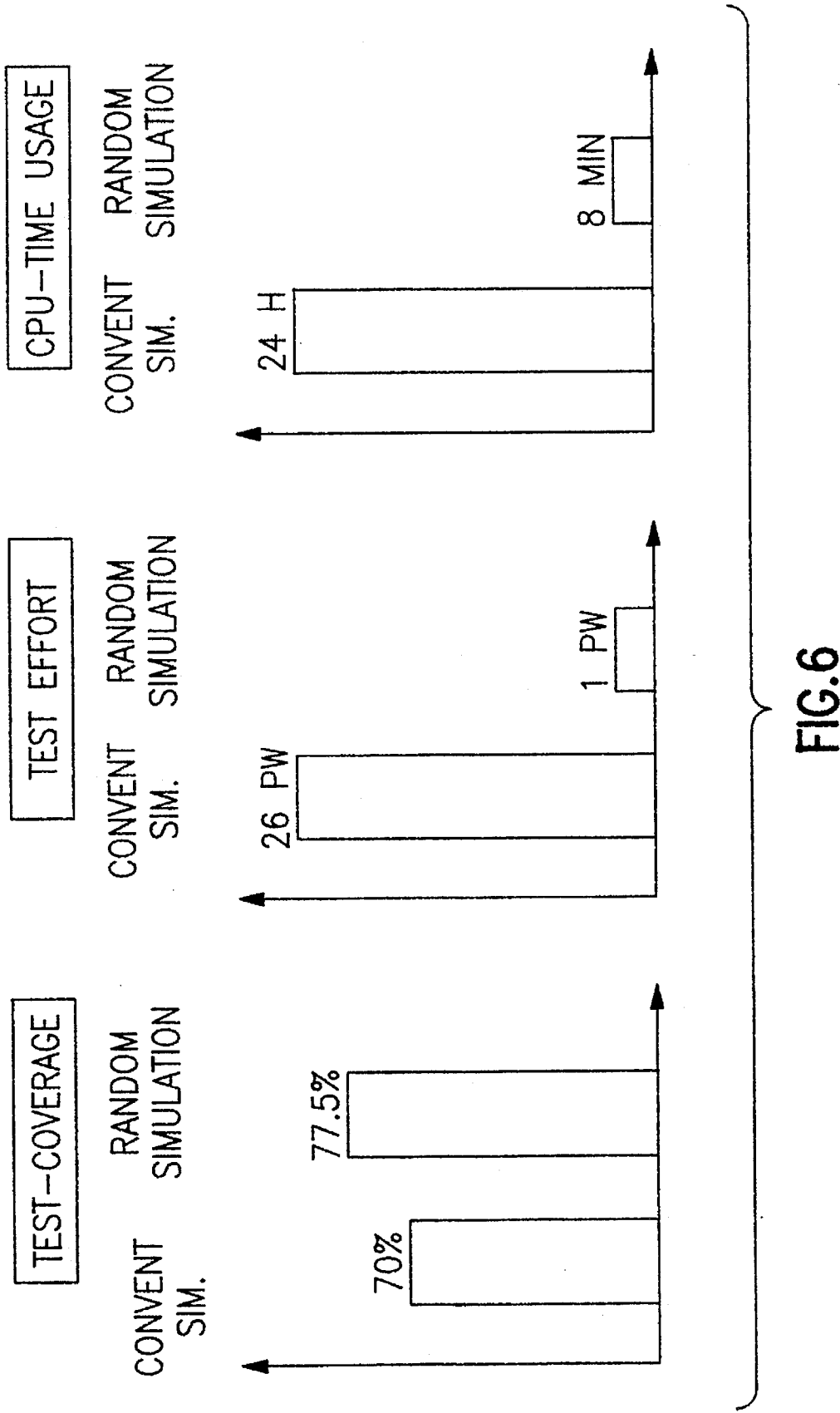
FIG. 6 depicts a comparison chart of the new/conventional approach in a simulation environment.

In FIG. 6, the results of a conventional approach, which relies on predicting the total state vector in a system environment, is compared with the new approach according to the present invention, which is used in an environment as depicted in FIG. 5. The notable difference is the test effort; the difference in the CPU usage is largely due to the much smaller model size.

For another exemplary application of the invention (FIGS. 7 and 8) the required means are built into chips and the design verification is carried out on a hardware level. The circuits required to support pseudo-random generation of commands, addresses and data are negligible compared with the circuit counts available today. The verification function can be integrated in all chips of a computer system. This permits execution of the test function with hardware speed.

Figure 7:
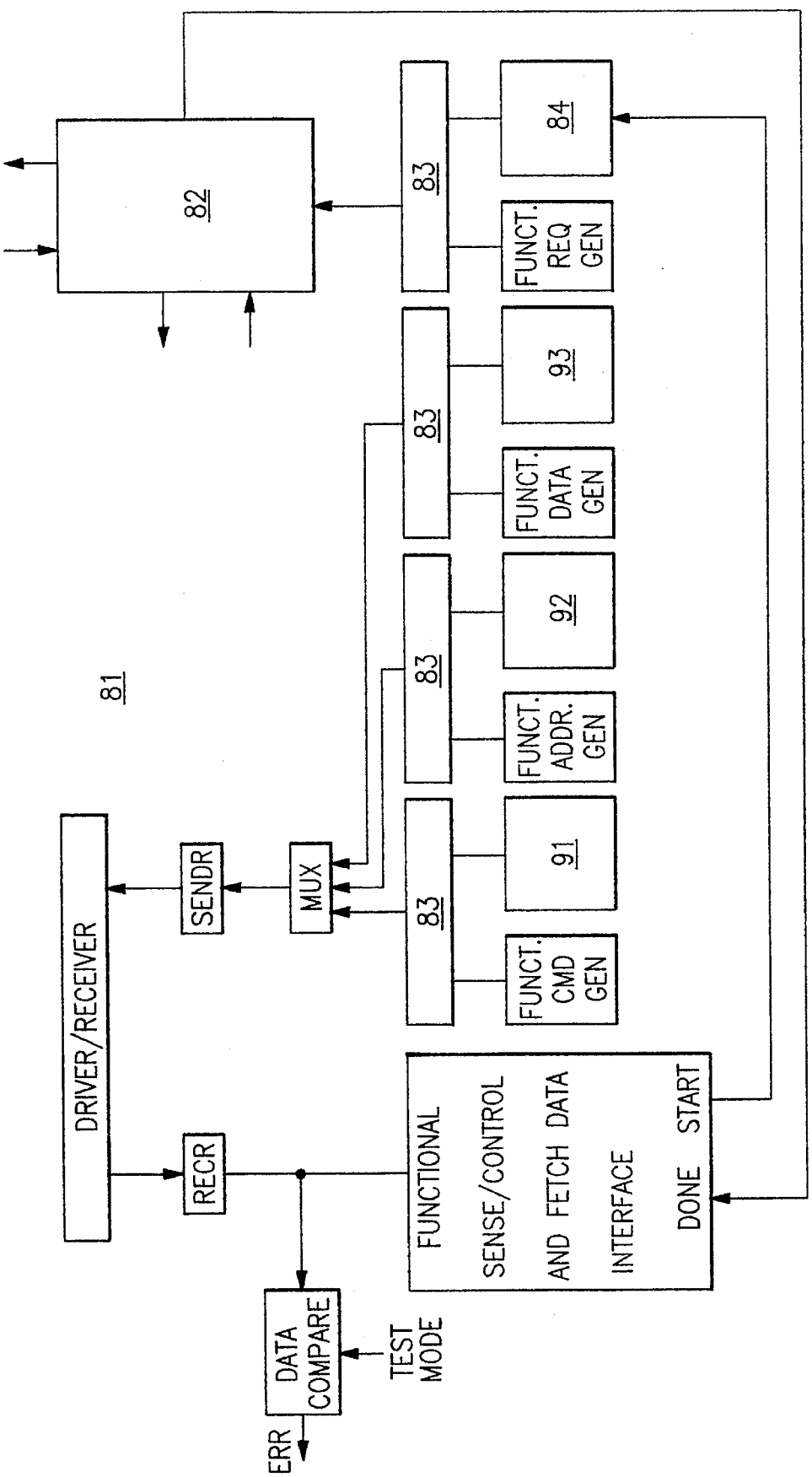
FIG. 7 exemplary shows a hardware built-in verification support of the claimed invention by integrating the test function into an IO-unit chip.

In order to demonstrate the basic principles of the invention, the main elements are shown in the context of an IO-unit chip 81. The mapping from the MIB 64 of FIG. 5 to the structure of FIG. 7 is straightforward.

A Functional Protocol State Machine 82 is used to execute all operations. From the view of the functional protocol state machine 82 only a multiplexor 83 must be switched to the corresponding random units, which can be accomplished with a Test Mode Signal. The sequential behavior is the same between the functional mode and the test mode. This is very important since design errors usually have their root in the wrong behavior of the state machine 82.

The data flow components are normally correctly designed or pre-verified. Therefore it is not a deficiency that these parts of the logic unit are not tested in this setup for the test mode.

Typically, in a system there is no place for a central trigger unit. Therefore, a decentralized approach is shown. In this case a trigger unit 84 may work totally independent from the trigger unit in the other chips, or it may be synchronized via a Sense/Control interface as shown in FIG. 7.

If an error is detected, the clocks are stopped and the debug can be performed in the usual way.

In the approach described, bus protocol errors can be relatively easily generated. In a normal system these events do not occur and are difficult to generate. In the case of the present invention this feature comes practically for free. The only requirement is that the units generate e.g. illegal codes or wrong parity.

Figure 8:
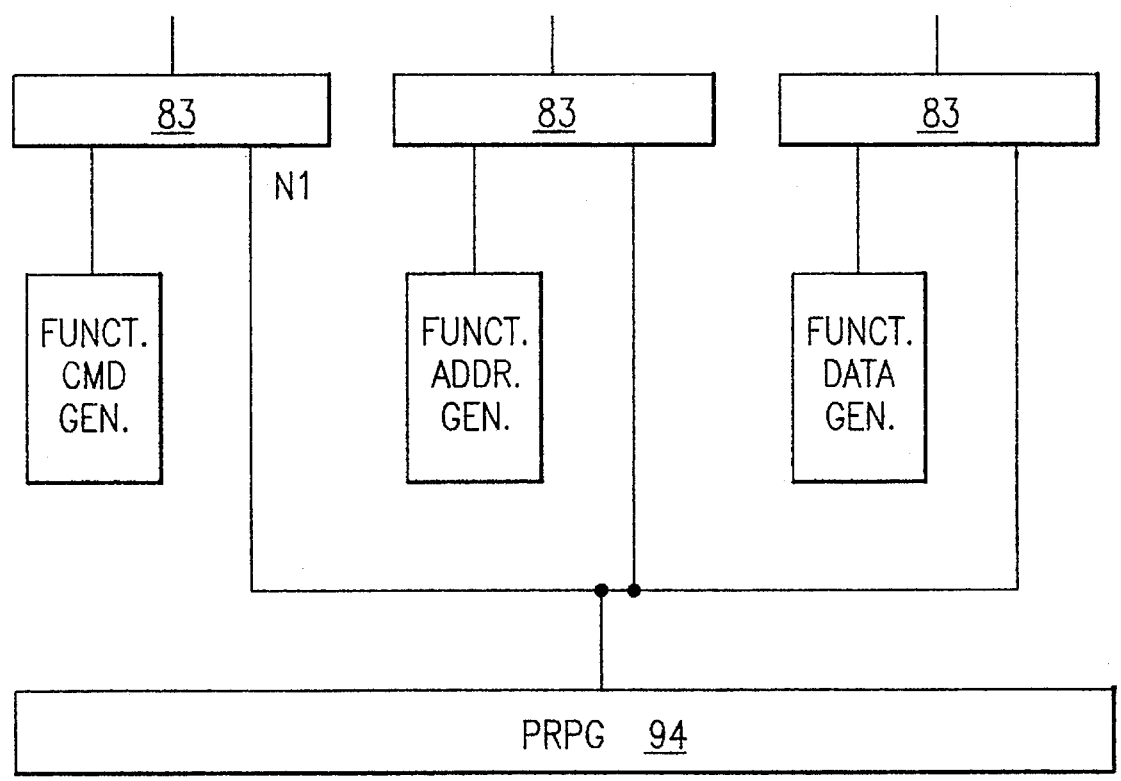
FIG. 8 shows the reduction of random blocks in a real application.

In accordance with the above described embodiment, the blocks random command generation 91, random address generation 92 and random data generation 93 are condensed to one random pattern generator 94 (PRPG), as shown in FIG. 8. This reduction of random blocks is advantageous because the need for hardware is drastically reduced.

With the support elements built into chips, there are two possible strategies for a verification using the hardware:

1. Only the chips at the starting and ending points of an operation have implemented this support. In the preferred embodiment shown in FIG. 7, this means that the IOUs 49, 50, 51, 52 the STC 44 and the PUs 41, 42 implement the additional hardware.
2. All chips, through which an operation passes, have implemented the additional hardware. In the embodiment of FIG. 7, this means that the PBA 45 has to implement the additional hardware too. This approach is superior, since it allows for better error isolation.

Although specific embodiments of the invention have been disclosed, it will be understood by those skilled in the art that changes can be made to these specific embodiments without departing from the spirit and scope of the invention. The following claims should be construed to maintain the proper protection for the invention first disclosed.

What is claimed is:

1. A method for the logic design verification of a logic unit wherein the logic unit includes at least one interface means for external communication, and wherein at least one test unit is connected with the logic unit via one of the interface means, and wherein each of the test units include a set of test operations which are carried into execution by the logic unit, said method comprising the steps of:

selecting, at said at least one test units a test operation from the set of test operations included therein, wherein said selection of said test operation at each of said at least one test units is performed pseudo-randomly and wherein said selection of said test operation at one of said at least one test units is independent from the selection of a test operation at the others of said at least one test units; and determining the starting times of the test operation for each of said at least one test units, wherein said determination of the starting times of the test operation for each of the at least one test units is performed pseudo-randomly and wherein said determination of a starting time at one of the at least one test units is independent from the determination of the starting times of the test operation at the others of said at least one test units; and providing said selected test operation to said logic unit at said determined start times via said at least one interface means to determine if there are any logical failures associated with the logic unit so as to verify the logical design of the logic unit;

wherein the step of selecting the test operations and the step of determining the starting times of the test operations at each of said at least one test units are executed independently of each other.

2. A method as in claim 1, wherein at least two test units are employed.

3. A method as in claim 1, wherein the each of the test units comprise an interface protocol level and a level for the selection of the test operations.

4. A method according to claim 1 wherein a single test unit is connected with the logic unit via the interface means such that the independence between multiple test units in said step of pseudo-randomly selecting the test operation at the test unit, and in said step of pseudo-randomly determining the start times of the test operation is not exhibited.

5. A method for the design verification of a logic unit wherein the logic unit includes at least one interface means for external communication, and wherein at least one test unit is connected with the logic unit via one of the interface means, and wherein each of the test units include a set of test operations which are carried into execution by the logic unit, said method comprising the steps of:

selecting the test operations;

determining the starting times of the test operations; and providing the selected test operations to the logic unit at said determined starting times via the at least one interface means to verify the logical design of the logic unit;

wherein the selecting of the test operations and determining the starting times of the test operations are executed pseudo-randomly and independently of each other, and wherein each of the test units comprise an interface protocol level and a level for the selection of test operations, and wherein the selection of the test operations is carried out by an operation select pointer, which is supplied with a pseudo-random number generated by a modulo operation based on an initial pseudo-random number and a maximum number of test operations.

6. A method as in claim 5, wherein the maximum number of test operations is delivered from the one of the interface means connecting one of the at least one test units to the logic unit.

7. A method as in claim 5, wherein the starting time of a test operation is determined by a reverse counter which delivers a start signal at a zero count.

8. A method as in claim 5, wherein an initial pseudo-random number and a maximum number of waiting cycles are used for the modulo operation and wherein the initial pseudo-random number is loaded into a reverse counter.

9. A method for the design verification of a logic unit according to claim 5, wherein a simulation environment is utilized, and wherein the at least one test units apply pseudo-random data to the logic unit and receive at a receiving side of said at least one test units, response data from the logic unit which are compared with predicted response data, said method further comprising the steps of:

pseudo-randomly selecting a test operation out of said included set of possible operations and pseudo-randomly selecting an address, to which test data is applied;

generating said pseudo-random data at said least one test units, using said pseudo-randomly selected address as a starting value to generate said pseudo-random data in such a way that the receiving side of said at least one test units can predict the response data to be received from said logic unit and compare the predicted data with the received response data;

providing said generated pseudo-random data to said logic unit;

receiving at said receiving side of said at least one test units the response data from said logic unit;

comparing the response data received from the logic unit with the predicted data expected for the selected test operation; and directing the selection of the test operation via a protocol state machine such that all elements of the operation protocol are controlled by the operation selection.

10. A method for the design verification of logic units according to claim 5, wherein pseudo-random instruction streams are generated and wherein at the end of each instruction stream the value of an architected state vector is compared with a simulated value which is derived from a high level description of the architecture.

11. A system for the logic design verification of a logic unit, which has at least one interface means and at least one bus means for external communication and operation means for operating a bus protocol, with at least one test unit, which is connected to the logic unit via the at least one interface means, and wherein each test unit comprises:

a set of test operations to be carried into execution by the logic unit;

means for a pseudo-random selection of a test operation from said included set of test operations, which are applied to the logic unit;

means for data generation and data comparison, which are used for comparing the generated data with the data obtained from the test operations applied to said logic unit, said comparison means permitting the determination of logical failures associated with said logic unit so as to verify the logical design of said logic unit;

trigger means being connected with each of the test units, the trigger means being used for pseudo-randomly determining the starting times of each of the test operations, respectively; and wherein said means for pseudo-random selection of the test operations and said trigger means for pseudo-randomly determining the starting times of each of the test operations operate independently of each other.

12. A system as in claim 11, wherein each test unit exhibits a level for the bus protocol, a level for the selection of test operations which are applied to the logic unit, and a level for the data generation and the data comparison.

13. A system for the design verification of a logic unit, which has at least one interface means and at least one bus means for external communication and operation means for operating a bus protocol, with at least one test unit, which is connected to the logic unit via the at least one interface means, and wherein each test unit comprises:

means for a pseudo-random selection of test operations, which are applied to the logic unit;

means for data generation and data comparison, which are used for comparing the generated data with the data obtained from the test operations performed on said logic unit, said comparison means permitting the determination of logical failures associated with said logic unit so as to verify the logical design of said logic unit; and trigger means being connected with each of the test units, the trigger means being used for pseudo-randomly determining the starting times of each of the test operations, respectively;

wherein each test unit exhibits a level for the bus protocol, a level for the selection of test operations which are applied to the logic unit, and a level for the data generation and the data comparison, and wherein the trigger means are connected with the operation select level of each test unit by two data lines, a first line for providing a START signal from the trigger means to the operation select level of each test unit, and a second line for providing a DONE signal from the operation select level of each data unit to the trigger means.

14. A hardware built-in design verification system according to claim 13, comprising:

a functional protocol state machine which is used for executing protocol operations;

a decentralized trigger unit which is used for delivering start times for test operations; and a pseudo-random pattern generator which is used for pseudo-randomly generating commands, pseudo-randomly generating addresses and pseudo-randomly generating data.

15. A system for the design verification of a logic unit, which has at least one interface means and at least one bus means for external communication and operation means for operating a bus protocol, with at least one test unit, which is connected to the logic unit via the at least one interface means, and wherein each test unit comprises:

means for a pseudo-random selection of test operations, which are applied to the logic unit;

means for data generation and data comparison, which are used for comparing the generated data with the data obtained from the test operations performed on said logic unit, said comparison means permitting the determination of logical failures associated with the logic unit so as to verify the logical design of said logic unit; and trigger means being connected with each of the test units, the trigger means being used for pseudo-randomly determining the starting times of each of the test operations, respectively;

wherein each test unit exhibits a level for the bus protocol, a level for the selection of test operations which are applied to the logic unit, and a level for the data generation and the data comparison, and wherein the operation select level has at least one pseudo-random pattern means comprising a pseudo-random pattern generator, a register for the maximum number of operations, a modulo operation device, an operation select pointer and a storage means which keeps a collection of the available operations.

16. A system for the design verification of a logic unit, which has at least one interface means and at least one bus means for external communication and operation means for operating a bus protocol, with at least one test unit, which is connected to the logic unit via the at least one interface means, and wherein each test unit comprises:

means for a pseudo-random selection of test operations, which are applied to the logic unit;

means for data generation and data comparison, which are used for comparing the generated data with the data obtained from the test operations performed on said logic unit, said comparison means permitting the determination of logical failures associated with the logic unit so as to verify the logical design of said logic unit; and trigger means being connected with each of the test units, the trigger means being used for pseudo-randomly determining the starting times of each of the test operations, respectively; and wherein the trigger means has at least one pseudo-random pattern means for each test unit, which comprises: a pseudo-random pattern generator generating pseudo-random numbers, a register for the maximum number of waiting cycles until the starting times of the operations, a modulo operation device which executes a modulo operation by use of the content of the pseudo-random pattern generator and the maximum number of waiting cycles, a reverse counter using the result of the modulo operation as the start number, and a start signal generator which effects the beginning of a test operation at a zero count of the reverse counter.

17. A system for the logic design verification of a logic unit where the logic unit comprises at least one interface means for external communication, and wherein at least one test unit is connected with the logic unit via one of the interface means, and wherein each of the test units comprise a set of test operations which are carried into execution by the logic unit, and wherein each of said test units further comprises:

means for pseudo-randomly selecting test operations from the set of test operations included therein to be applied to the logic unit, wherein the selection means enable the selection of the test operations at one of said at least one test units to be executed independently from the selection of the test operations at the others of said at least one test units;

means for pseudo-randomly determining the starting times of the test operations, wherein the determination means enable the determination of the starting times of the test operations at one of said at least one test units to be executed independently from the determination of the starting times of the test operations at the others of said at least one test units; and means for providing said selected test operations to said logic unit at said determined start times via said at least one interface means to determine whether there are any logical failures associated with the logic unit so as to verify the logical design of the logic unit;

wherein both the selection of test operations and the determination of their start times are executed pseudo-randomly and independently of each other at each of the at least one test units.

18. A system as in claim 17, wherein at least two test units are employed.

19. A system as in claim 17, wherein the each of the test units comprise an interface protocol level and a level for the selection of the test operations.

20. A system according to claim 17 wherein a single test unit is connected with the logic unit via the interface means such that the independence between the multiple test units enabled by said selection means, and by said determination means is not exhibited.

21. A system for the design verification of a logic unit where the logic unit comprises at least one interface means for external communication, and wherein at least one test unit is connected with the logic unit via one of the interface means, and wherein each of the test units comprise a set of test operations which are carried into execution by the logic unit to permit the determination of logical failures associated with the logic unit so as to verify the logical design of the logic unit; and wherein both selection of test operations and determination of their start times are executed randomly and independently of each other, and wherein the selection of a test operation is carried out by an operation select pointer, which is supplied with a pseudo-random number being generated by a modulo operation based on an initial pseudo-random number and a maximum number of test operations.

22. A system as in claim 21, wherein the maximum number of test operations is delivered from the one of the interface means connecting one of the at least one test units to the logic unit.

23. A system as in claim 21, wherein the starting time of a test operation is determined by a reverse counter which delivers a start signal at a zero count.

24. A system as in claim 21, wherein an initial pseudo-random number and a maximum number of waiting cycles are used for the modulo operation and wherein the initial pseudo-random number is loaded into a reverse counter.

25. A system for the design verification of a logic unit according to claim 21, wherein a simulation environment is utilized, and wherein the at least one test units apply to the logic unit pseudo-random data and receive at a receiving side of said at least one test units, response data from the logic unit which are compared with predicted response data, comprising:

an operation select means for the pseudo-random selection of a test operation out of the set of possible test operations at said at least one test units, and for the pseudo-random selection of an address, to which test data are applied;

a data generation means for generating said pseudo-random data in such a way that the receiving side of said at least one test units can predict the response data from the logic unit and compare the predicted data with the received response data;

a data compare means which compares the response data received from the logic unit with the predicted data expected for the selected test operation, wherein the value of the pseudo-randomly selected address is used as a starting value for the pseudo-random generation of the data; and a protocol state machine which directs the operation select means to select an operation wherein all the elements of the operation protocol are controlled by this means.

26. A system for the design verification of logic units according to claim 21, wherein pseudo-random instruction streams are generated and wherein at the end of each instruction stream the value of an architected state vector is compared with a simulated value which is derived from a high level description of the architecture.

* * * * *